(12) United States Patent
Mor (10) Patent No.: US 10,571,709 B2
(45) Date of Patent: Feb. 25, 2020

(54) INTEGRATED STRUCTURED-LIGHT PROJECTOR

(71) Applicant: Apple Inc., Cupertino, CA (US)

(72) Inventor: Zafrir Mor, Ein Habsor (IL)

(73) Assignee: Apple Inc., Cupertino, CA (US)

( * ) Notice: Subject to any disclaimer, the term of this patent is extended or adjusted under 35 U.S.C. 154(b) by 147 days.

(21) Appl. No.: 15/648,473

(22) Filed: Jul. 13, 2017

(65) Prior Publication Data

US 2018/0059430 A1 Mar. 1, 2018

Related U.S. Application Data

(60) Continuation of application No. 15/068,661, filed on Mar. 14, 2016, now Pat. No. 9,740,019, which is a
(Continued)

(51) Int. Cl.
*G02B 27/42* (2006.01)
*H01S 5/42* (2006.01)
(Continued)

(52) U.S. Cl.
CPC ...... *G02B 27/4205* (2013.01); *G01B 11/2513* (2013.01); *H01S 5/02288* (2013.01);
(Continued)

(58) Field of Classification Search
CPC .... G02B 27/4205; G02B 5/18; G02B 5/1814; G02B 5/1861; G02B 5/1866;
(Continued)

(56) References Cited

U.S. PATENT DOCUMENTS 5,325,386 A 6/1994 Jewell et al.
5,774,219 A 6/1998 Matsuura
(Continued)

FOREIGN PATENT DOCUMENTS

CN 101267086 A 9/2008
CN 102611002 A 7/2012
(Continued)

OTHER PUBLICATIONS

International Application PCT/US2018/040531 search report dated Nov. 8, 2018.
(Continued)

*Primary Examiner* — William R Alexander
*Assistant Examiner* — Henry A Duong
(74) *Attorney, Agent, or Firm* — Kligler & Associates Patent Attorneys Ltd (57) ABSTRACT

Optoelectronic apparatus includes a substrate and an array of light-emitting elements formed on a semiconductor die and mounted on the substrate, wherein the array includes at least first and second sets of the light-emitting elements. A controller is coupled to drive the first set of the light-emitting elements independently from the second set of the light-emitting elements. A first optical element is mounted on the substrate to receive light emitted from the array of light-emitting elements and to direct the received light toward the second optical element. A second optical element projects the light received from the first optical element so as to create a pattern.

15 Claims, 6 Drawing Sheets

Related U.S. Application Data continuation-in-part of application No. 14/296,463, filed on Jun. 5, 2014, now Pat. No. 9,825,425, which is a continuation-in-part of application No. 14/727,884, filed on Jun. 2, 2015, now abandoned, which is a division of application No. 14/231,764, filed on Apr. 1, 2014, now Pat. No. 9,091,413, which is a continuation of application No. 13/008,042, filed on Jan. 18, 2011, now abandoned, which is a continuation-in-part of application No. 12/762,373, filed on Apr. 19, 2010, now abandoned.

(60) Provisional application No. 61/836,682, filed on Jun. 19, 2013, provisional application No. 61/300,465, filed on Feb. 2, 2010.

(51) Int. Cl.
*G01B 11/25* (2006.01)
*H01S 5/022* (2006.01)

(52) U.S. Cl.
CPC .......... *H01S 5/423* (2013.01); *H01S 5/02276* (2013.01); *H01S 5/02292* (2013.01)

(58) Field of Classification Search
CPC ............... G02B 5/1871; G02B 5/1876; G01B 11/2513; H01S 5/02288; H01S 5/423; H01S 5/02276; H01S 5/02292
USPC ........................................................ 359/569
See application file for complete search history.

(56) References Cited

U.S. PATENT DOCUMENTS

| | | | |
|---|---|---|---|
| 5,784,396 A | 7/1998 | Guerin | |
| 5,809,053 A | 9/1998 | Nakatsuka et al. | |
| 6,002,705 A | 12/1999 | Thornton | |
| 6,026,110 A | 2/2000 | Makino | |
| 6,222,868 B1 | 4/2001 | Ouchi et al. | |
| 6,281,867 B2 * | 8/2001 | Kurematsu | 345/589 |
| 6,798,438 B2 | 9/2004 | Beier et al. | |
| 2002/0153422 A1 | 10/2002 | Tsikos et al. | |
| 2003/0021326 A1 | 1/2003 | Liao et al. | |
| 2004/0011457 A1 | 1/2004 | Kobayashi et al. | |
| 2006/0192845 A1 | 8/2006 | Cordingley et al. | |
| 2007/0273957 A1 | 11/2007 | Zalevsky et al. | |
| 2008/0205462 A1 | 8/2008 | Uchida | |
| 2008/0232412 A1 | 9/2008 | Mizuuchi et al. | |
| 2008/0240502 A1 * | 10/2008 | Freedman | G01B 11/2513 382/103 |
| 2008/0279241 A1 * | 11/2008 | Oki | B82Y 20/00 372/45.01 |
| 2009/0010297 A1 | 1/2009 | Uchida | |
| 2009/0185274 A1 * | 7/2009 | Shpunt | G02B 27/0944 359/558 |
| 2010/0311502 A1 | 12/2010 | Miller et al. | |
| 2012/0223218 A1 | 9/2012 | Miyasaka | |
| 2012/0249743 A1 * | 10/2012 | Kim | H04N 5/23293 348/46 |
| 2012/0293625 A1 | 11/2012 | Schneider et al. | |
| 2014/0199844 A1 | 7/2014 | Palmer | |
| 2014/0354367 A1 | 12/2014 | Suzuki et al. | |
| 2015/0260830 A1 | 9/2015 | Ghosh et al. | |
| 2016/0072258 A1 | 3/2016 | Seurin et al. | |
| 2016/0164261 A1 | 6/2016 | Warren | |

FOREIGN PATENT DOCUMENTS

| | | |
|---|---|---|
| CN | 105048282 A | 11/2015 |
| JP | 2000114656 A | 4/2000 |
| JP | 2011003748 A | 1/2011 |
| JP | 2011228553 A | 11/2011 |
| KR | 1020070018805 A | 2/2007 |
| WO | 2009153446 A2 | 12/2009 |
| WO | 2015078857 A1 | 6/2015 |

OTHER PUBLICATIONS

KR Application # 10-2013-0023877 office action dated Jan. 22, 2019.
U.S. Appl. No. 15/265,877 Office Action dated Aug. 25, 2017.
U.S. Appl. No. 15/844,662 office action dated Apr. 2, 2018.
KR Application # 10-2013-0023877 office action dated Jul. 31, 2019.
TW Application # 107129761 office action dated Apr. 8, 2019.
CN Application # 201821292011.1 Utility Model Patent Evaluation Report (UMPER) dated Sep. 16, 2019.
U.S. Appl. No. 15/953,460 office action dated Nov. 15, 2019.
U.S. Appl. No. 16/524,313 office action dated Nov. 22, 2019.
CN Utility Model Patent #201821292011.1 Notification of Review Opinions on Patentability Evaluation Report dated Dec. 2, 2019.
EP Patent Application # 19189860.0 Extended Search Report dated Nov. 27, 2019.

\* cited by examiner

INTEGRATED STRUCTURED-LIGHT PROJECTOR

CROSS-REFERENCE TO RELATED APPLICATIONS

This application is a continuation of U.S. patent application Ser. No. 15/068,661, filed Mar. 14, 2016, which is a continuation-in-part of U.S. patent application Ser. No. 14/296,463, filed Jun. 5, 2014, which claims the benefit of U.S. Provisional Patent Application 61/836,682, filed Jun. 19, 2013. This application is also a continuation-in-part of U.S. patent application Ser. No. 14/727,884, filed Jun. 2, 2015, which is a division of U.S. patent application Ser. No. 14/231,764, filed Apr. 1, 2014 (now U.S. Pat. No. 9,091,413), which is a continuation of U.S. patent application Ser. No. 13/008,042, filed Jan. 18, 2011 (now abandoned), which is a continuation-in-part of U.S. patent application Ser. No. 12/762,373, filed Apr. 19, 2010 (now abandoned), and claims the benefit of U.S. Provisional Patent Application 61/300,465, filed Feb. 2, 2010. All of these related applications are incorporated herein by reference.

FIELD OF THE INVENTION

The present invention relates generally to optoelectronic devices, and specifically to integrated projection devices.

BACKGROUND

Miniature optical projectors are used in a variety of applications. For example, such projectors may be used to cast a pattern of coded or structured light onto an object for purposes of 3D mapping (also known as depth mapping). In this regard, U.S. Patent Application Publication 2008/0240502, whose disclosure is incorporated herein by reference, describes an illumination assembly in which a light source, such as a laser diode or LED, transilluminates a transparency with optical radiation so as to project a pattern onto the object. (The terms "optical" and "light" as used herein refer generally to any of visible, infrared, and ultraviolet radiation.) An image capture assembly captures an image of the pattern that is projected onto the object, and a processor processes the image so as to reconstruct a three-dimensional (3D) map of the object.

PCT International Publication WO 2008/120217, whose disclosure is incorporated herein by reference, describes further aspects of the sorts of illumination assemblies that are shown in the above-mentioned US 2008/0240502. In one embodiment, the transparency comprises an array of micro-lenses arranged in a non-uniform pattern. The micro-lenses generate a corresponding pattern of focal spots, which is projected onto the object.

Optical projectors may, in some applications, project light through one or more diffractive optical elements (DOEs). For example, U.S. Patent Application Publication 2009/0185274, whose disclosure is incorporated herein by reference, describes apparatus for projecting a pattern that includes two DOEs that are together configured to diffract an input beam so as to at least partially cover a surface. The combination of DOEs reduces the energy in the zero-order (undiffracted) beam. In one embodiment, the first DOE generates a pattern of multiple beams, and the second DOE serves as a pattern generator to form a diffraction pattern on each of the beams.

As another example, U.S. Patent Application Publication 2011/0188054, whose disclosure is incorporated herein by reference, describes photonics modules that include optoelectronic components and optical elements in a single integrated package. In one embodiment, an integrated photonics module (IPM) comprises radiation sources in the form of a two-dimensional matrix of optoelectronic elements, which are arranged on a substrate and emit radiation in a direction perpendicular to the substrate. Such an IPM typically comprises multiple, parallel rows of emitters, such as light-emitting diodes (LEDs) or vertical-cavity surface-emitting laser (VCSEL) diodes, forming a grid in the X-Y plane. The radiation from the emitters is directed into an optical module, comprising a suitable patterned element and a projection lens, which projects the resulting pattern onto a scene.

U.S. Patent Application Publication 2013/038881, whose disclosure is incorporated herein by reference, describes integrated pattern generators in which laser diodes (such as VCSELs) are arranged in a pattern that is not a regular lattice. Optics may be coupled to project the pattern of light emitted by the elements of a laser diode array into space as a pattern of corresponding spots, wherein each spot contains the light emitted by a corresponding laser diode in the array. In some embodiments, a DOE creates multiple replicas of the pattern, fanning out over an expanded angular range.

SUMMARY

Embodiments of the present invention provide integrated optical projection devices that may be used particularly in projection of patterned radiation.

There is therefore provided, in accordance with an embodiment of the present invention, optoelectronic apparatus, including a semiconductor die and a monolithic array of light-emitting elements formed on the semiconductor die in a grid pattern including multiple columns. Conductors are formed on the die so as to define a respective common contact for driving each column of the light-emitting elements.

In disclosed embodiments, the light-emitting elements include vertical-cavity surface-emitting lasers (VCSELs).

In some embodiments, the apparatus includes optics configured to project light emitted by the light-emitting elements so as to generate a pattern of stripes, each stripe corresponding to a respective one of the columns. The optics may include a diffractive optical element (DOE), which is configured to create multiple replicas of the pattern of stripes generated by the light-emitting elements. Additionally or alternatively, the optics include a cylindrical projection lens.

In some embodiments, the apparatus includes a substrate, wherein the optics and the semiconductor die are mounted together on the substrate. The optics may include a folding mirror that is mounted on the substrate.

Additionally or alternatively, the apparatus includes a controller, which is configured to drive the light-emitting elements by actuating different groups of the columns in alternation.

There is also provided, in accordance with an embodiment of the present invention, optoelectronic apparatus, including a semiconductor die and a monolithic array of light-emitting elements formed on the semiconductor die in a grid pattern including multiple columns. Optics including a diffractive optical element (DOE) are mounted on the substrate and configured to project the light emitted by the elements so as to generate a pattern of stripes corresponding to the columns of the grid pattern.

In disclosed embodiments, the DOE is configured to create multiple replicas of the pattern.

In some embodiments, the apparatus includes a controller, which is configured to drive the light-emitting elements to generate a time sequence of stripe patterns by actuating different groups of the columns in alternation.

In some embodiments, the optics include a cylindrical lens, which may have a cylinder axis that is angled relative to the columns of the grid pattern of the light-emitting elements.

There is additionally provided, in accordance with an embodiment of the present invention, optoelectronic apparatus, including a substrate having an opening therethrough, and an array of light-emitting elements arranged on the substrate. A folding mirror is mounted on the substrate and positioned to turn light emitted by the light-emitting elements toward the substrate. Optics mounted on the substrate are configured to project the light turned by the folding mirror through the opening.

In some embodiments, the light-emitting elements and the optics are configured to generate and project a pattern, which may include multiple stripes corresponding respectively to the columns in the array of the light-emitting elements.

In one embodiment, the folding mirror includes a prism.

There is further provided, in accordance with an embodiment of the present invention, optoelectronic apparatus, including a substrate and an array of light-emitting elements arranged on the substrate in a grid pattern including multiple columns. Optics are configured to project light emitted by the light-emitting elements so as to generate a pattern of stripes, each stripe corresponding to a respective one of the columns. A controller is configured to drive the light-emitting elements by actuating different groups of the columns in alternation so as to generate the pattern of the stripes.

In some embodiments, the controller is configured to drive the light-emitting elements in the different groups so as to generate a time sequence of stripe patterns of varying spatial periods.

There is moreover provided, in accordance with an embodiment of the present invention, an optical method, which includes providing an array of light-emitting elements arranged on a substrate in a grid pattern including multiple columns. The light-emitting elements are driven to emit light. Optics are mounted on the substrate to project the light emitted by the elements so as to generate a pattern of stripes corresponding to the columns of the grid pattern.

The present invention will be more fully understood from the following detailed description of the embodiments thereof, taken together with the drawings in which:

DESCRIPTION OF EMBODIMENTS

VCSEL arrays can be used advantageously in producing compact, high-intensity light sources and projectors. Embodiments of the present invention that are described hereinbelow use VCSEL grid arrays for directly projecting a pattern of multiple stripes of light into space. This sort of approach provides inexpensive devices that are capable of generating stripe patterns with dense coverage. When used to project patterns onto a scene in 3D mapping applications, these patterns enable simplified matching of images of the scene to a corresponding reference image along an epipolar line.

When a uniform stripe pattern of this sort is used in 3D mapping, however, the pattern at any given location in the image is not locally unique (in contrast to projectors that project non-uniform patterns), and this lack of uniqueness may cause ambiguity in matching. In some embodiments of the present invention, this pattern ambiguity is resolved by projecting a sequence of stripe patterns with different spatial periods. These embodiments provide emitter arrays capable of creating such stripe patterns simply and economically, with dynamic control of the stripe period.

Although the embodiments described below use VCSELs for this purpose, arrays of edge-emitting laser diodes (of the sort described in the above-mentioned US 2011/0188054, for example) may alternatively be used. Such embodiments can use an addressable laser array, with a suitable folding mirror to turn the beams away from the substrate, followed by optical components as described hereinbelow. For example, the sort of array that is shown in FIG. 8 of US 2011/0188054 may be adapted for this purpose, mutatis mutandis.

Some embodiments of the present invention, as described hereinbelow, provide integrated pattern projection modules using emitter arrays of the sorts noted above. Such modules have the advantages of simplicity of design and production and can achieve cost and size reduction, as well as better performance, in comparison with projection devices that are known in the art. Pattern projection modules of this sort may be used advantageously in the sorts of 3D mapping systems that are described in the publications mentioned above.

Figure 1:
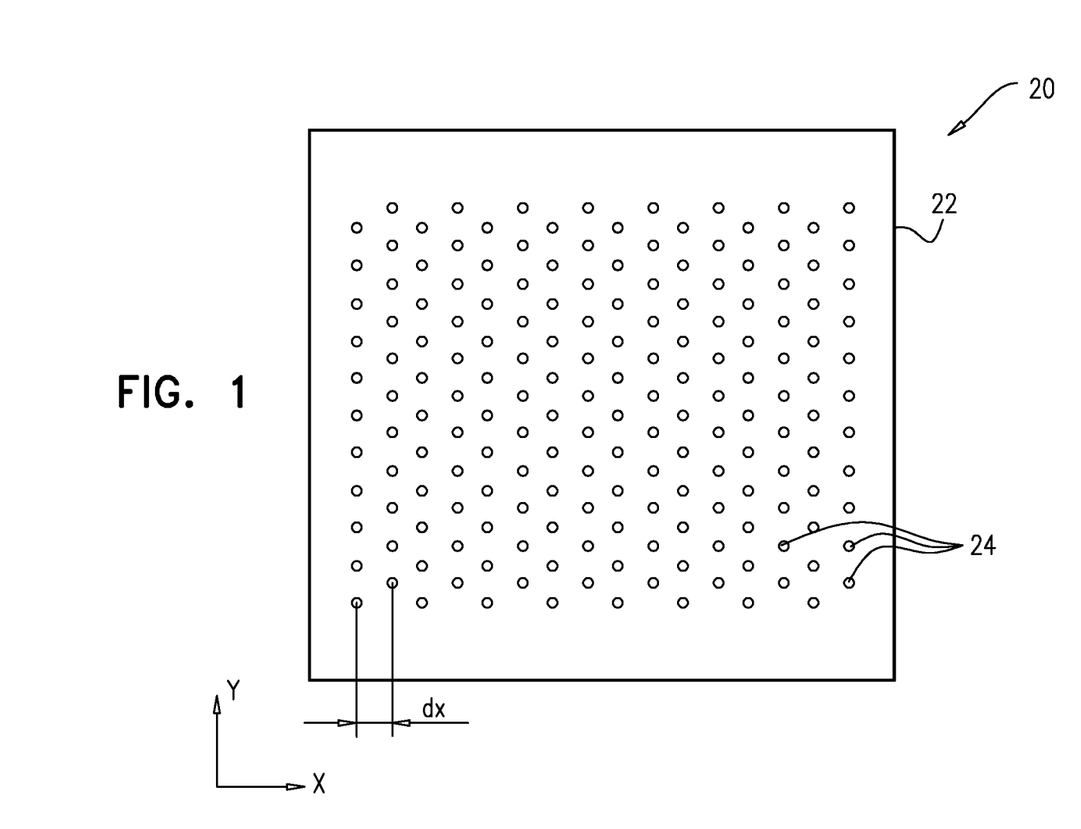
FIG. 1 is a schematic top view of a device comprising a semiconductor die on which a monolithic array of emitters has been formed, in accordance with an embodiment of the present invention.

FIG. 1 is a schematic top view of an integrated optoelectronic device 20, comprising a semiconductor die 22 on which a monolithic VCSEL array has been formed, in accordance with an embodiment of the present invention. The array comprises VCSEL emitters 24 in a hexagonal lattice pattern, which is efficient in terms of emitters per unit area. The array includes N columns with M emitters 24 per column. The distance between columns is $dx=d\sqrt{3}/2$, wherein d is the emitter pitch within each column.

Monolithic VCSEL arrays of the sort shown in FIG. 1 have the advantage of high power scalability. For example, using current technology, a die with an active area of 1 mm² can contain 600 emitters, with a total optical power output of about 3 W or more. The VCSEL diodes emit circular beams. If a spherical lens with the VCSEL die at its focus is used to project the light emitted by the VCSEL array, the resulting spot pattern in space will have the same shape as the VCSEL pattern.

On the other hand, if a cylindrical lens is used for projection, with the cylinder axis parallel to the VCSEL columns axis, a pattern of lines will be projected, wherein each line contains the integrated power from the M emitters in the column. The projection angle of the lines is directly defined by the VCSEL beam divergence (typically on the order of 15°), while the angular line pitch is given by arctan(dx/f), wherein f is the focal length of the lens. Some of the embodiments described below use a cylindrical projection lens in this manner.

The pattern field of view (FOV) along the X-axis will then be approximately N times the line pitch. This FOV may not be sufficient for some applications, but an additional optical element can be used to create multiple replicas of the stripe pattern, over a predefined angular range, as shown in the figures that follow.

Figure 2A:
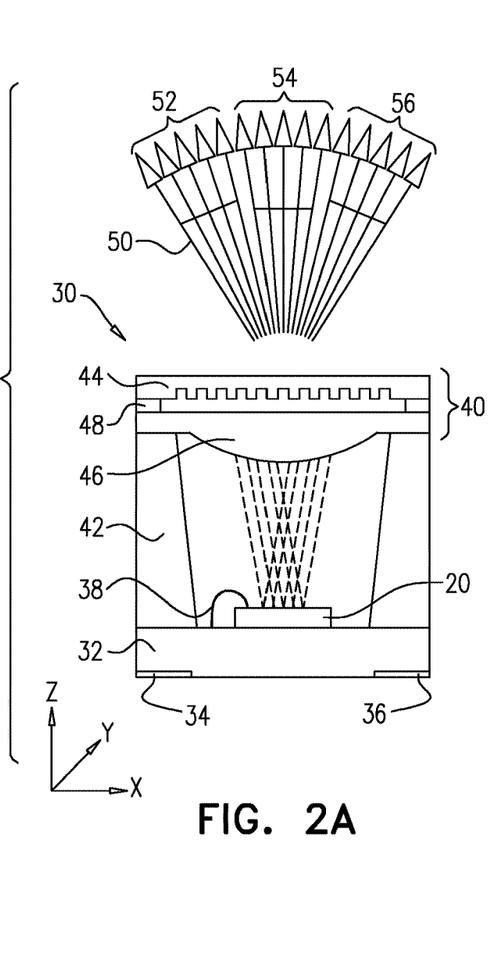
FIGS. 2A-2C are schematic side views of integrated optical projection modules, in accordance with embodiments of the present invention.

FIG. 2A is a schematic side view of an integrated optical projection module 30 containing a VCSEL array, such as the array in device 20 shown in FIG. 1, in accordance with an embodiment of the present invention. VCSEL die 22 is typically tested at wafer level, and is then diced and mounted on a suitable substrate, referred to as a sub-mount 32, with appropriate electrical connections 34, 36, 38. Optics 40, including a cylindrical projection lens 46, are mounted over the die on suitable spacers 42. Lens 46 collects and projects an output beam 50 of the VCSEL emitters. For temperature stability, a glass lens may be used. A diffractive optical element (DOE) 44, supported by thin spacers 48, creates multiple replicas 52, 54, 56 of the pattern of the lines of the VCSEL array, fanning out over a predefined angular range. The DOE may, for example, comprise a Damman grating or a similar element, as described in the above-mentioned U.S. Patent Application Publication 2009/0185274.

Figure 2B:
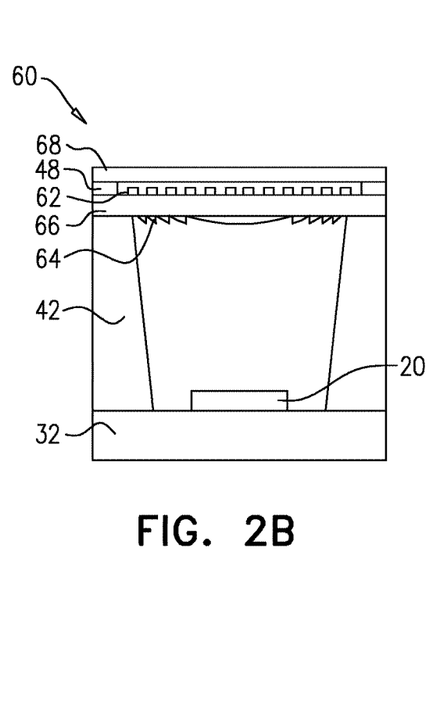

FIG. 2B is a schematic side view of an integrated optical projection module 60 containing a VCSEL array, in accordance with another embodiment of the present invention. In this embodiment, the refractive projection lens of FIG. 2A is replaced by a diffractive lens 64, which may be formed on one side of an optical substrate 66, while a fan-out DOE 62 is formed the opposite side of the same optical substrate 66. Although diffractive lenses are sensitive to wavelength variations, the relative stability of the wavelength of the VCSEL elements makes this approach feasible. A cover glass 68 may be added to protect the DOE.

Figure 2C:
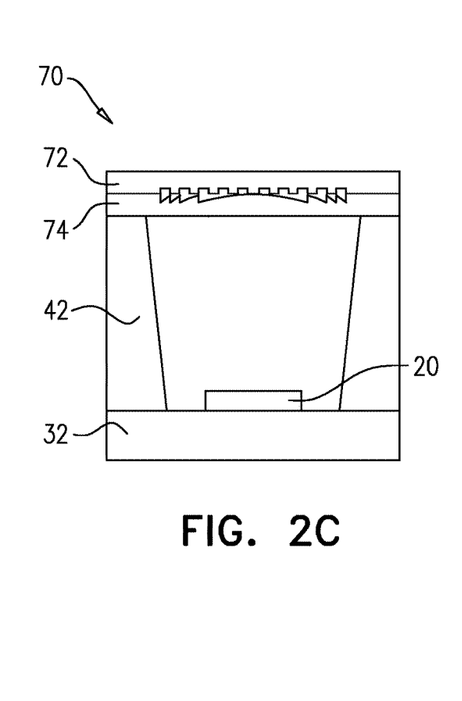

FIG. 2C is a schematic side view of an integrated optical projection module 70 containing a VCSEL array, in accordance with an alternative embodiment of the present invention. In this case, both a diffractive lens 74 and a fan-out DOE 72 are produced as single-side diffractive elements. This embodiment is particularly advantageous in that the optical elements can be formed and mounted so that the sensitive active layers are protected within the module, while the outer facet has a flat surface.

Figure 3:
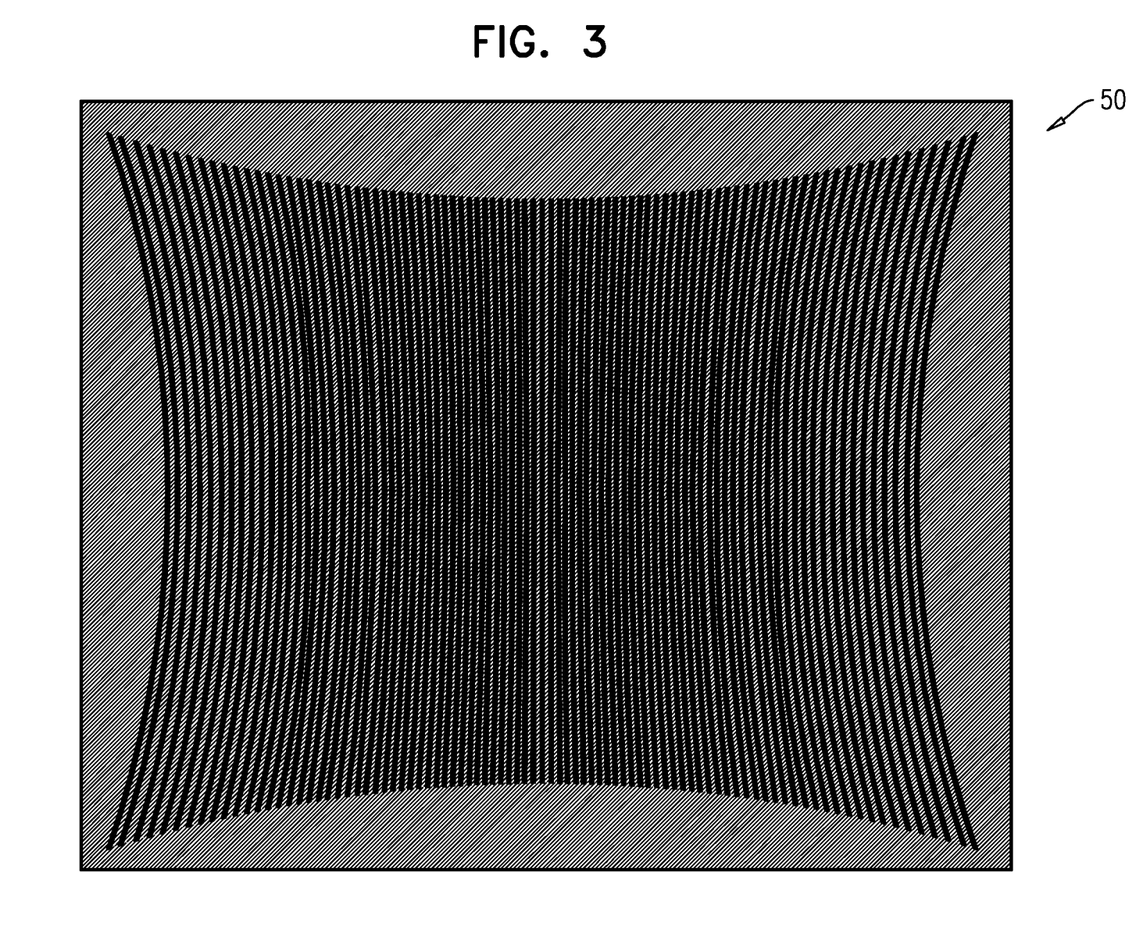
FIG. 3 is a schematic frontal view of a pattern of stripes created by an integrated optical projection module, in accordance with an embodiment of the present invention.

FIG. 3 is a schematic frontal view of a pattern of stripes that is created in output beam 50 by optics 40 in module 30, in accordance with an embodiment of the present invention. As noted earlier, beam 50 comprises replicas 52, 54, 56 of the pattern of the VCSEL lines, but the stripes in the pattern have the shape of a distorted square, due to pincushion distortion. The DOE is designed so that the projected replicas of the pattern tile a surface or region of space, as described, for example, in U.S. Patent Application Publication 2010/0284082, whose disclosure is incorporated herein by reference.

During assembly of the modules shown in FIGS. 2A-C, the DOE is typically aligned in four dimensions (X, Y, Z and rotation) relative to the VCSEL die. The embodiments of 2B and 2C may be advantageous in terms of alignment, since the photolithographic processes that are used to produce both the VCSEL array and the DOE/diffractive lens structure are accurate to about 1 μm, thus permitting passive alignment in X, Y and rotation simply by matching fiducial marks. Z-alignment (i.e., the distance between the VCSEL die and the DOE and lens) requires only a small range of motion, due to the high accuracy of production. Z-alignment may thus be accomplished either actively, while the VCSEL array is under power, or possibly passively, using a height-measuring device, such as a confocal microscope, for example, to measure the distance between the VCSEL surface and DOE surface.

The modules of FIGS. 2A-C may be used as pattern projectors in depth mapping systems that make use of structured light. The tiled pattern (as illustrated in FIG. 3, for example) is projected onto an object of interest, and a suitable camera captures an image of the pattern on the object. A processor measures the local transverse shift of the pattern, relative to a known reference, at each point in the image and thus finds the depth coordinate of that point by triangulation based on the local shift, using methods of image processing that are known in the art.

As noted earlier, however, since the stripes in the pattern are not unique, the range of depth mapping is limited to a depth corresponding to a shift between two lines. To resolve this ambiguity, the laser diode array may be controlled so as to project a sequence of patterns with different stripe periods, as explained below.

Figure 4:
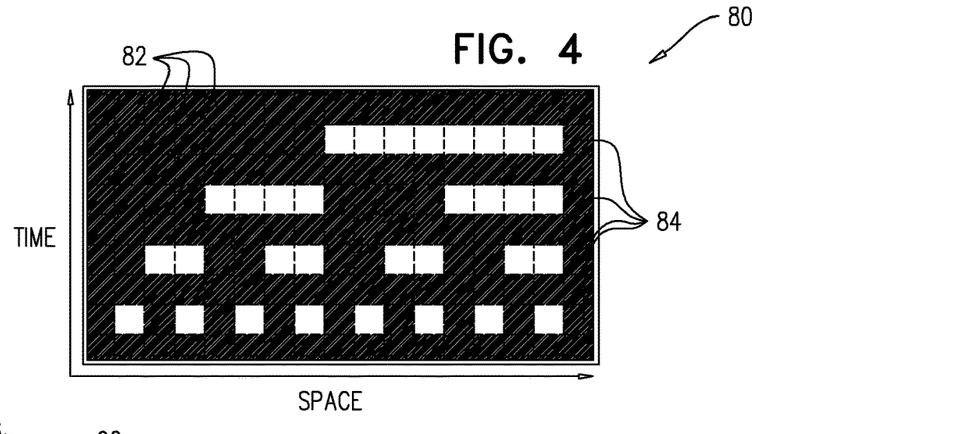
FIG. 4 is a plot that schematically illustrates a time sequence of stripe patterns of varying periods, in accordance with an embodiment of the present invention.

FIG. 4 is a plot that schematically illustrates a time sequence 80 of stripe patterns 84 of varying spatial periods, in accordance with an embodiment of the present invention. Each column 82 corresponds to one of the sixteen stripes of VCSEL emitters 24, and the status of the stripe (light or dark) in each row of the plot indicates whether the stripe is turned on or off at a given time. In this example, time sequence 80 comprises four stripe patterns, which are projected in succession. This sequence produces a unique binary illumination code in each of sixteen vertical columns. In general, a sequence of log 2N patterns can be used to cover and encode the entire measurement range of N columns. Time-coded illumination patterns of this sort and their use in depth mapping are described further, for example, in PCT International Publication WO 2012/066501, whose disclosure is incorporated herein by reference.

The coding scheme shown in FIG. 4 can be viewed as a simple sort of Gray code. In alternative embodiments, however, the VCSEL arrays that are shown in the figures that follow can be driven to generate other unique codes that may be more efficient than the Gray code of FIG. 4.

Figure 5A:
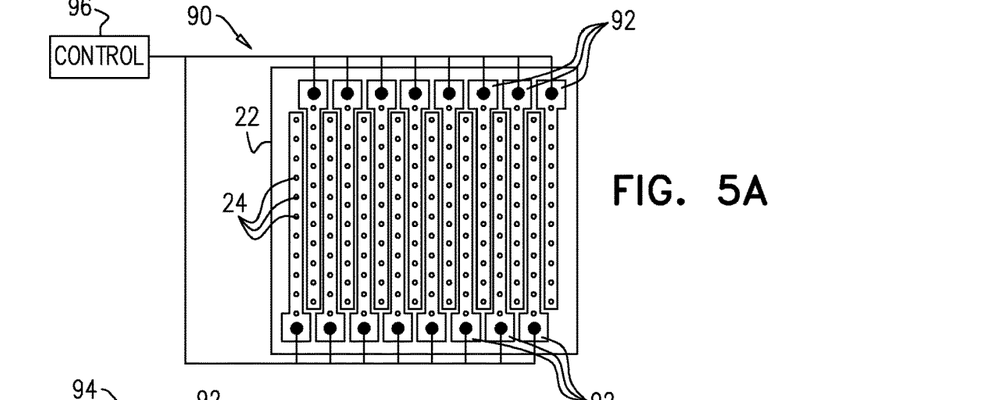
FIGS. 5A and 5B are schematic top views of semiconductor dies on which monolithic arrays of emitters have been formed, in accordance with embodiments of the present invention.

FIG. 5A is a schematic top view of a monolithic array 90 of VCSELs 24, which has been formed on the semiconductor substrate of die 22, in accordance with an embodiment of the present invention. Array 90 is similar to the array of FIG. 1, except that in the embodiment of FIG. 5A there are sixteen groups of VCSELs 24 arranged in separate columns, which are driven by separate, respective conductors, which are formed on the substrate with a single, common contact 92 for each column. A controller 96 selects the columns to actuate by applying appropriate drive signals to the respective contacts 92. Although the columns of VCSELs shown in FIG. 5A are vertical, the term "column" should be understood, in the context of the present patent application and in the claims, to denote any group of emitters that are arranged in a line, regardless of whether that line is vertical, horizontal or diagonal in the frame of reference of the substrate on which the emitters are arrange.

Controller 96 may drive the sixteen columns of VCSELs 24 that are shown in FIG. 5A in order to create the pattern sequence that is shown in FIG. 4 by actuating different groups of columns in alternation. Thus, the uppermost pattern in FIG. 4 is created by actuating the eight columns at the right side of the array to create a single wide stripe, the next pattern is created by actuating the rightmost four columns on each of the left and right sides of the array to create two stripes, and so forth. The arrangement of common contacts 92 with the corresponding conductor for each column of array 90 is particularly advantageous in simplifying the operation and connections of controller 96 that are needed to generate pattern sequences of this sort. In alternative embodiments, however, optical projection modules comprising grid arrays of emitters with other sorts of addressing schemes may also be driven to generate such pattern sequences.

Figure 5B:
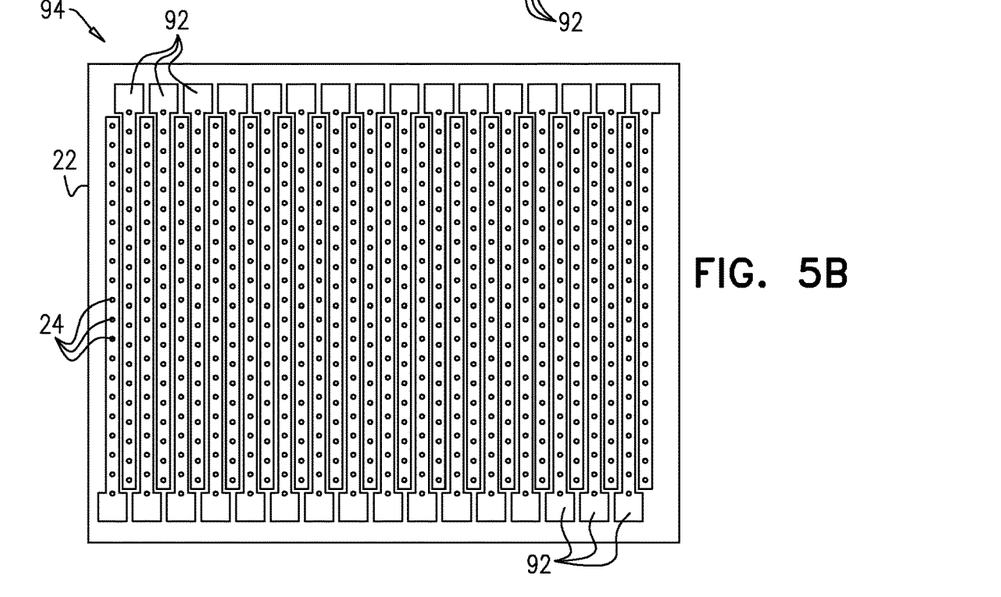

FIG. 5B is a schematic top view of a monolithic array 94 of VCSELs 24, which has been formed on semiconductor die 22 in accordance with another embodiment of the present invention. Monolithic VCSEL arrays of the sorts shown in FIGS. 5A and 5B have the advantage of high power scalability, and thus make it possible to scale up both the power and the number of columns in the array. FIG. 5B shows the extension of the monolithic VCSEL array of FIG. 5A to thirty-two columns, with a fourfold increase in total power.

The VCSEL dies of FIGS. 5A-B may be mounted in and attached to the leads of a standard lead-frame package, such as the Thin Shrink Small Outline Package (TSSOP). Such packages are typically sealed (with epoxy, for example) after attachment of the die and wire bonding. In the present embodiments, however, the package can be closed over the VCSEL die by a spacer and DOE, as shown in FIGS. 2B-C, for example.

Alternatively, the VCSEL die may be assembled on other substrate, such a silicon wafer. Such a wafer substrate may be passive, used only for fan-out of the VCSEL contacts. Alternatively, the silicon wafer substrate may comprise an active chip, which also includes driver and controller circuits. This latter approach can we achieve better integration and smaller form factor, since it obviates the need for an additional driver chip. It also reduces the number of pins in the assembly, since instead of a pin per column of the VCSELs, pins are needed only for input power, strobe/flash signals, and an I2C or other serial interface, for programming the light emitting code into the controller.

The embodiments illustrated in FIGS. 2A-C and FIG. 5A-B assume that light is emitted from the top surface of the VCSELs, and the anodes are connected via wire-bonds. Alternatively, for some wavelength ranges (for instance above 900 nm for GaAs emitters), the VCSELs may be configured to emit light through the substrate. In this case, the VCSELs can be designed for BSI (Back-Side Illumination), and the die may be assembled as a flip-chip on a submount or driver chip.

The upper three patterns shown in FIG. 4 require that the light emitted by the VCSELs in two or more neighboring columns be combined into a single wide stripe, rather than appearing as separate, discrete stripes as shown in FIG. 3. In other words, the bright stripes projected due to emission from adjacent VCSEL columns should be wide enough to meet at their respective edges, without substantial gaps or overlap between the adjoining stripes. This object can be achieved by rotation of the VCSEL array relative to the cylindrical lens, as explained below.

Figure 6A:
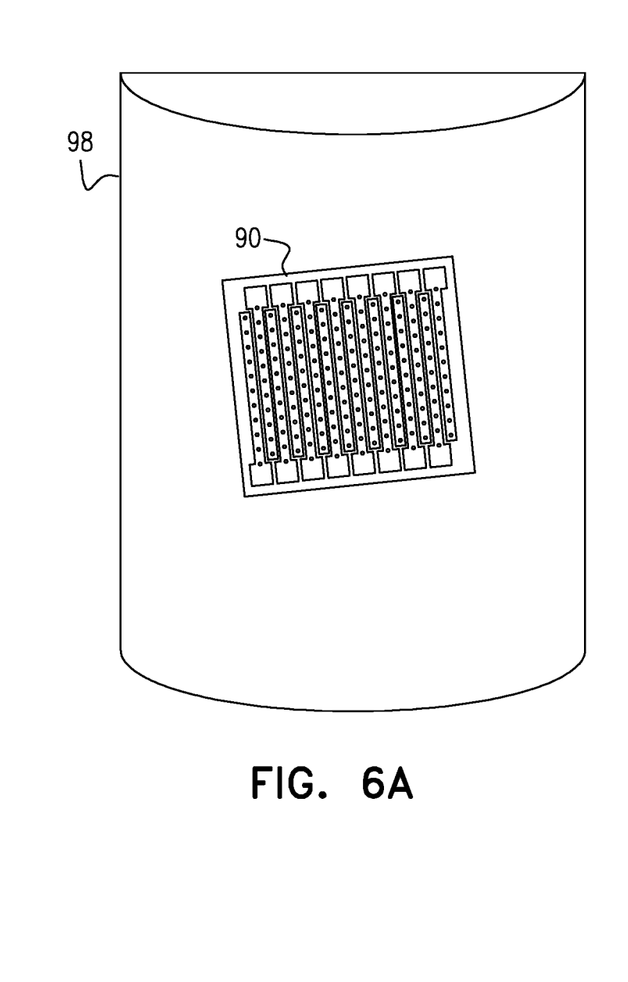
FIG. 6A is a schematic top view of an emitter array and cylindrical lens in an optical projection module, in accordance with an embodiment of the present invention.

FIG. 6A is a schematic top view of emitter array 90 with a cylindrical lens 98 in an optical projection module, in accordance with an embodiment of the present invention. Array 90 is rotated by a small angle, typically less than 10°, relative to the cylinder axis of lens 98. The rotation angle may advantageously be set to $\arctan(\sqrt{3}/2M)$, wherein M is the number of emitters in a column of array 90. In this arrangement, each emitter creates a stripe that is slightly offset relative to its neighbors, and these individual stripes combine to form a broader stripe over each of the VCSEL columns. The distance along the X-axis (in the horizontal direction in the figure) between the bottom emitter of one column and the top emitter in the next column is identical to the distance between neighboring emitters.

Figure 6B:
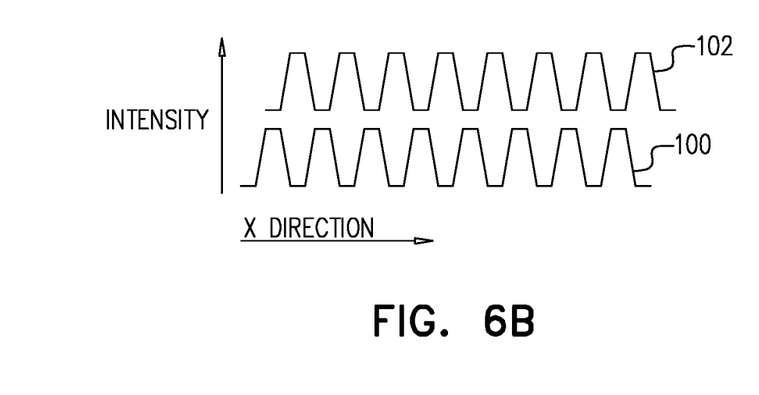
FIG. 6B is a plot that schematically illustrates temporal variations of the intensity of stripes in a pattern projected by the optical projection module of FIG. 6A, in accordance with an embodiment of the present invention.

FIG. 6B is a plot that schematically illustrates temporal variations of the intensity of stripes in a pattern projected by the optical projection module of FIG. 6A, in accordance with an embodiment of the present invention. Traces 100 and 102 in the figure respectively show the intensities along the X-axis of the pattern projected by the module at two alternate times: In trace 100, the even columns of array 90 are actuated, while in trace 102, the odd columns are actuated. The resulting pattern has a 50% duty cycle, and the pattern created by actuation of the odd columns (bottom contacts) is inverse to the pattern created by actuation the even columns (top contacts).

The arrangement shown in FIG. 6A provides the ability to create any desired complementary code, such as the code illustrated by the two traces in FIG. 6B. This arrangement facilitates simple stripe detection in the captured images, using a sequential differential code. By subtracting two sequential images of a complementary code, any intensity variation caused by the scene and ambient light can be eliminated.

The pattern density of an integrated projector as described hereinabove is defined by the ratio between the column pitch and the focal length of the projection lens, while the stripe width defines the minimum object width that can detected. Thus, to achieve a denser pattern, it is desirable that the lens have a long focal length and therefore be placed relatively far from the emitter array. In many cases, however, the large projector height required to accommodate a lens of long focal length and thereby achieve the desired pattern density is a key limitation on the ability of the designer to reduce the thickness of the product in which the projector is to be embedded. Pattern density could be increased by shrinking the pitch of the array, but this dimension is bounded by the physical limitations of VCSEL production and wire-bonding. (Typically, the column pitch is at least 30 µm). Therefore, there can be a difficult tradeoff between the product thickness and the system resolution requirement. Projectors in accordance with the embodiments of the present invention that are described below can be used to relax the thickness requirements.

Figure 7A:
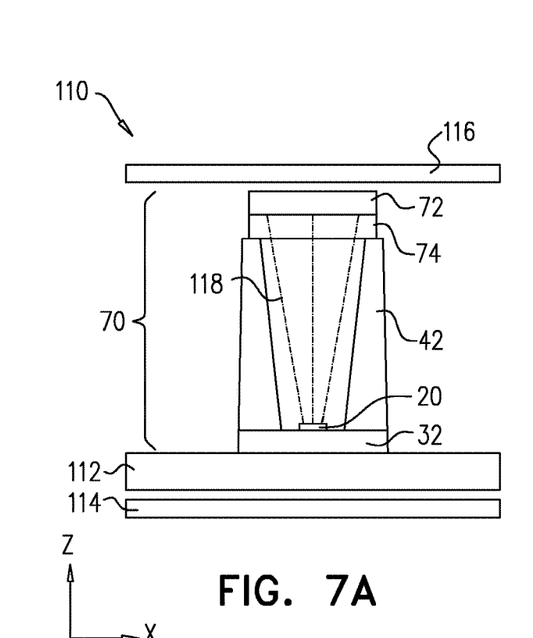
FIGS. 7A-7C are schematic side views of projectors comprising integrated optical projection modules, in accordance with alternative embodiments of the present invention.

FIG. 7A is a schematic side view of a projector 110 comprising integrated optical projection module 70 containing a VCSEL array, in accordance with an embodiment of the present invention. This embodiment illustrates the minimum thickness limitations explained above. In projector 110, module 70 is attached above a main chassis 112 or printed circuit board of the product in which projector 110 is integrated, with product covers 114 and 116 below and above (typically comprising plastic or glass). A beam 118 emitted from device 20 impinges on lens 74 and DOE 72, at a distance from device 20 that is chosen in order to give the desired pattern density. In the projector configuration shown in FIG. 7A, this distance is the key factor in the overall thickness (in the Z-direction) of the product.

Figure 7B:
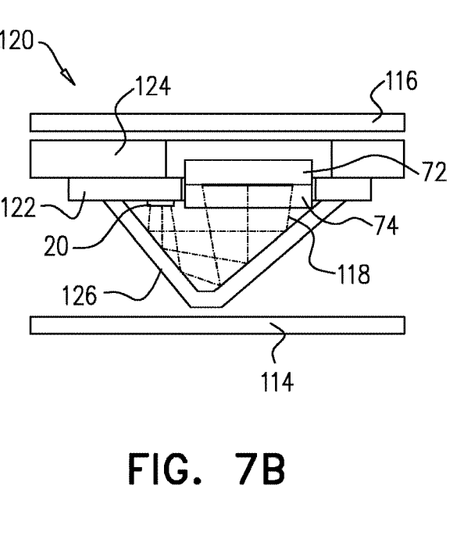

FIG. 7B is a schematic side view of a projector 120 comprising an integrated optical projection module, in accordance with another embodiment of the present invention. The structure of projector 120 enables reduced product thickness while achieving the same pattern resolution as projector 110, shown in FIG. 7A. In projector 120, device 20 containing the VCSEL array and lens 74 and DOE 72 are all attached to a single substrate 122, side by side. A folding mirror 126 is glued to the same substrate, taking the place of spacers (shown in FIG. 7A), while creating the same optical distance between the VCSELs and the DOE.

To assemble projector 120, device 20 is first mounted and wire-bonded to substrate 122, folding mirror 126 is glued in place, and finally DOE 72 and lens 74 are aligned and glued to the substrate. Projector 120 is attached to a product chassis 124 (with a hole above the DOE), in a location close to front cover 116 (instead of the rear as in the preceding embodiment). In operation, folding mirror turns the light emitted by device 20 around toward substrate 122, so that the light is incident on lens 74 and DOE 72, which direct the light through an opening in the substrate as shown in the figure.

Figure 7C:
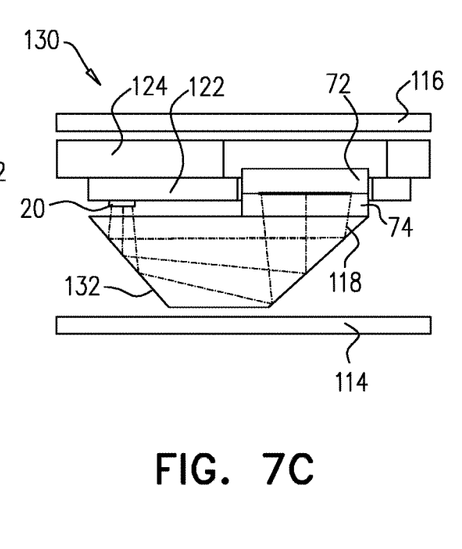

FIG. 7C is a schematic side view of a projector 130 comprising an integrated optical projection module, in accordance with an alternative embodiment of the present invention. The configuration of projector 130 is similar to the integrated projector of FIG. 7B, except that the function of the folding mirror is performed by an optical prism 132. DOE 72 and lens 74 are glued to prism 132 (by an optical UV-cured glue, for example), to create one optical element. This element is then aligned and glued to substrate 122 with device 20. Although a prism typically costs more than a mirror, it can lead to a simpler and more stable projector assembly. An additional advantage of the prism is that because its refractive index is larger than that of air, and it can be used to increase the physical distance between the VCSEL and DOE, for the same optical distance, thus relaxing mechanical constraints.

Although some of the embodiments described above are directed particularly to generation of stripe patterns, the principles of the present invention may similarly be applied, mutatis mutandis, in generating and projecting patterns of other sorts using monolithic arrays of light-emitting elements. Such patterns may comprise not only regular geometrical figures, but also variable shapes and even pseudo-random arrangements of spots.

It will thus be appreciated that the embodiments described above are cited by way of example, and that the present invention is not limited to what has been particularly shown and described hereinabove. Rather, the scope of the present invention includes both combinations and sub combinations of the various features described hereinabove, as well as variations and modifications thereof which would occur to persons skilled in the art upon reading the foregoing description and which are not disclosed in the prior art.

The invention claimed is:

1. Optoelectronic apparatus, comprising:
a substrate;
an array of light-emitting elements formed on a semiconductor die and mounted on the substrate, wherein the array includes at least first and second sets of the light-emitting elements;
a controller coupled to drive the first set of the light-emitting elements independently from the second set of the light-emitting elements; and
first and second optical elements, wherein the first optical element is mounted on the substrate to receive light emitted from the array of light-emitting elements and to direct the received light toward the second optical element, and wherein the second optical element projects the light received from the first optical element so as to create a pattern,
wherein the second optical element comprises a diffractive optical element (DOE), and
wherein the pattern comprises pattern components corresponding to the set of the light-emitting elements, and wherein the DOE is configured to create an expanded pattern comprising multiple replicas of the pattern components, which fan out over a predefined angular range.

2. The apparatus according to claim 1, wherein the DOE is configured to project the multiple replicas of the light pattern so that the expanded pattern tiles a surface or region of space, whereby the surface or region is covered by multiple adjacent replicas of the light pattern, without substantial overlaps or gaps between the replicas.

3. The apparatus according to claim 1, and comprising a camera, which is configured to capture an image of an object onto which the pattern is projected.

4. The apparatus according to claim 3, and comprising a processor, which is configured to process the captured image so as to generate a three-dimensional (3D) map of the object.

5. The apparatus according to claim 4, wherein the processor is configured to generate the 3D map by measuring a local transverse shift of the projected pattern, relative to a known reference, at each point in the image and finding a depth coordinate of the point by triangulation based on the local shift.

6. The apparatus according to claim 1, wherein the pattern is a pseudo-random pattern.

7. The apparatus according to claim 1, wherein the light-emitting elements comprise vertical-cavity surface-emitting lasers (VCSELs).

8. The apparatus according to claim 1, wherein the controller, which is configured to actuate the first and second sets of the light-emitting elements at different, first and second times.

9. The apparatus according to claim 8, wherein the controller is configured to drive the light-emitting elements to generate a time sequence of patterns by actuating the sets of the light-emitting elements in alternation.

10. Optoelectronic apparatus, comprising:
a substrate;
an array of light-emitting elements formed on a semiconductor die and mounted on the substrate, wherein the array includes at least first and second sets of the light-emitting elements;
a controller coupled to drive the first set of the light-emitting elements independently from the second set of the light-emitting elements; and
first and second optical elements, wherein the first optical element is mounted on the substrate to receive light emitted from the array of light-emitting elements and to direct the received light toward the second optical element, and wherein the second optical element projects the light received from the first optical element so as to create a pattern,
wherein the first optical element comprises a folding mirror, which is mounted on the substrate.

11. The apparatus according to claim 10, wherein the second optical element comprises a diffractive optical element (DOE).

12. The apparatus according to claim 10, wherein the second optical element comprises a projection lens, which is mounted on the substrate.

13. The apparatus according to claim 10, wherein the folding mirror is configured to turn the light emitted from the array of light-emitting elements toward the substrate, so that the light passes through an opening in the substrate.

14. The apparatus according to claim 10, wherein the folding mirror comprises a prism.

15. Optoelectronic apparatus, comprising:
a substrate;
an array of light-emitting elements formed on a semiconductor die and mounted on the substrate, wherein the array includes at least first and second sets of the light-emitting elements;
a controller coupled to drive the first set of the light-emitting elements independently from the second set of the light-emitting elements; and
first and second optical elements, wherein the first optical element is mounted on the substrate to receive light emitted from the array of light-emitting elements and to direct the received light toward the second optical element, and wherein the second optical element projects the light received from the first optical element so as to create a pattern,
wherein the second optical element comprises a cylindrical lens.

* * * * *